US012630917B2

(12) United States Patent  
Shono et al.

(10) Patent No.: US 12,630,917 B2  
(45) Date of Patent: May 19, 2026

(54) SPUTTERING TARGET AND METHOD FOR PRODUCING SAME

(71) Applicant: JX Advanced Metals Corporation, Tokyo (JP)

(72) Inventors: Daiki Shono, Ibaraki (JP); Shuhei Murata, Ibaraki (JP); Takeo Okabe, Ibaraki (JP)

(73) Assignee: JX Advanced Metals Corporation, Tokyo (JP)

(*) Notice: Subject to any disclaimer, the term of this patent is extended or adjusted under 35 U.S.C. 154(b) by 501 days.

(21) Appl. No.: 17/279,092

(22) PCT Filed: Sep. 20, 2019

(86) PCT No.: PCT/JP2019/037136  
§ 371 (c)(1),  
(2) Date: Mar. 23, 2021

(87) PCT Pub. No.: WO2020/066957  
PCT Pub. Date: Apr. 2, 2020

(65) Prior Publication Data  
US 2022/0033960 A1    Feb. 3, 2022

(30) Foreign Application Priority Data  
Sep. 26, 2018    (JP) ................................ 2018-180535

(51) Int. Cl.  
*C23C 14/34*        (2006.01)  
*B21J 1/02*        (2006.01)  
*B21J 5/00*        (2006.01)

(52) U.S. Cl.  
CPC ........... *C23C 14/3414* (2013.01); *B21J 1/025* (2013.01); *B21J 5/008* (2013.01)

(58) Field of Classification Search  
None  
See application file for complete search history.

(56) References Cited

U.S. PATENT DOCUMENTS

2003/0132108 A1    7/2003  Takahashi et al.  
2008/0271779 A1*  11/2008  Miller ................. C23C 14/0089  
                                                          204/192.12

(Continued)

FOREIGN PATENT DOCUMENTS

EP          2832895 A1      2/2015  
JP      2011-084795 A      4/2011

(Continued)

OTHER PUBLICATIONS

Office Action in JP Application No. 2020-549175 dated Apr. 5, 2022, 8 pages.

(Continued)

*Primary Examiner* — Jason Berman  
(74) *Attorney, Agent, or Firm* — MARSHALL, GERSTEIN & BORUN LLP

(57)                ABSTRACT

Provided is a cylindrical sputtering target made of a metal material, which has reduced particles. The sputtering target includes at least a target material, wherein the target material comprises one or more metal elements, the target material has a crystal grain size of 50 μm or less, and the target material has an oxygen concentration of 1000 ppm by mass or less.

14 Claims, 4 Drawing Sheets

(56)                References Cited

U.S. PATENT DOCUMENTS

| | | |
|---|---|---|
| 2011/0038181 A1 | 2/2011 | Yan et al. |
| 2015/0041313 A1 | 2/2015 | Komiyama |
| 2016/0005576 A1 | 1/2016 | Tsukamoto |
| 2016/0126072 A1 | 5/2016 | Endo |
| 2017/0009336 A1 | 1/2017 | Komatsu et al. |
| 2017/0029934 A1 | 2/2017 | Linke et al. |
| 2020/0016660 A1 | 1/2020 | Dasai et al. |

FOREIGN PATENT DOCUMENTS

| | | | | |
|---|---|---|---|---|
| JP | 2017510701 A | * | 4/2013 | ............ B22F 3/1028 |
| JP | 2013/204052 A | | 10/2013 | |
| JP | 5783293 B1 | * | 9/2015 | .............. C22C 9/00 |
| JP | 2017/066434 A | | 4/2017 | |
| JP | 2018/053366 A | | 4/2018 | |
| JP | 2018/172716 A | | 11/2018 | |
| KR | 2015-0119284 A | | 10/2015 | |
| KR | 2018-0085059 A | | 7/2018 | |

| | | | |
|---|---|---|---|
| TW | 392210 | B1 | 4/2013 |
| WO | WO-2015/004958 | A1 | 1/2015 |
| WO | WO-2018/163861 | A1 | 9/2018 |

OTHER PUBLICATIONS

Extended European Search Report in EP Application No. 19867644.7 dated Jun. 24, 2022, 11 pages.
Search Report in International Application No. PCT/JP2019/037136 dated Nov. 5, 2019.
Office Action in KR Application No. 10-2021-7009533 dated Apr. 21, 2023, 11 pages.
International Preliminary Report on Patentability and Written Opinion in International Application No. PCT/JP2019/037136 dated Apr. 8, 2021, 10 pages.
Huang et al., "The Effects of Heat Treatment on the Mechanical Properties of Cold-sprayed Coatings", Surface & Coatings Technology 261, 2015, pp. 278-288.

* cited by examiner

SPUTTERING TARGET AND METHOD FOR PRODUCING SAME

FIELD OF THE INVENTION

The present disclosure relates to a sputtering target and a method for producing the same. More particularly, the present disclosure relates to a cylindrical sputtering target and a method for producing the same.

BACKGROUND OF THE INVENTION

Recently, in a field of semiconductor devices, integration and miniaturization at higher levels are required. For example, when producing semiconductor devices, various thin films are formed. Materials of the thin films include molybdenum, tungsten, and titanium. For the forming of the thin films, sputtering is used.

The principle of sputtering is as follows. First, a high voltage is applied between a substrate and a sputtering target while introducing an inert gas (e.g., an Ar gas) in vacuum. Ionized ions such as $Ar^+$ are then allowed to collide with the sputtering target. An energy of the collision releases atoms in the sputtering target to deposit them on the substrate. The thin film can be thus formed.

A shape of the sputtering target includes a flat plate and a cylindrical shape. Patent Literature 1 discloses a cylindrical sputtering target made of at least one metal selected from the group consisting of aluminum, silver, copper, titanium and molybdenum. Further, Patent Literature 1 discloses a method for producing a cylindrical sputtering target. Specifically, it discloses that for a metal-based sputtering target, a material of the cylindrical sputtering target is extruded, or a central part is hollowed out to form a cylindrical shape, or casting is carried out to form a cylindrical shape. Patent Literature 2 discloses that powder is sintered to form a cylindrical rough shape material, and then forged on a core rod at a temperature of 1000° C. or more.

CITATION LIST

Patent Literatures

[Patent Literature 1] Japanese Patent Application Publication No. 2018-053366 A
[Patent Literature 2] Japanese Patent Application Publication No. 2017-510701 A

SUMMARY OF THE INVENTION

Technical Problem

As described above, in the field of semiconductor devices, integration and miniaturization at higher levels are required. The generation of particles during sputtering is not desirable as it causes various defects in a product. Therefore, it is an object of the present disclosure to provide a cylindrical sputtering target made of a metal material, which has reduced particles.

Solution to Problem

As a result of intensive studies, the present inventors have succeeded in producing a cylindrical sputtering target by another approach. More particularly, a cylindrical billet has been formed by processing a circular pillar shaped billet by BTA (Boring & Training Association) type deep hole drilling or the like. However, since a structure of the cylindrical billet itself has a large crystal grain size, the crystal grain size of the target material becomes coarse only by that step. Therefore, the cylindrical billet has been further subjected to plastic processing to obtain a cylindrical target material. This has caused a lot of strain to be introduced into the structure. The cylindrical target material thus obtained has been further subjected to a recrystallization heat treatment as needed, so that a fine crystal grain size could be achieved.

In one aspect, the invention that has been completed based on the above findings includes the following inventions:
(Invention 1)
    A cylindrical sputtering target, wherein:
    the sputtering target comprises at least a target material;
    the target material comprises one or more metal elements;
    the target material has a crystal grain size of 50 μm or less; and
    the target material has an oxygen concentration of 1000 ppm by mass or less.
(Invention 2)
    The sputtering target according to Invention 1, wherein the crystal grain size is more than 10 μm.
(Invention 3)
    The sputtering target according to Invention 1 or 2, wherein the target material is seamless.
(Invention 4)
    The sputtering target according to any one of Inventions 1 to 3, wherein the metal element is titanium.
(Invention 5)
    A method for producing the sputtering target according to any one of Inventions 1 to 4, comprising the steps of:
    processing a circular pillar shaped billet comprising one or more metal elements into a cylindrical billet; and
    subjecting the cylindrical billet to plastic processing.
(Invention 6)
    The method according to Invention 5, wherein the plastic processing comprises forging the cylindrical billet while passing a core rod through the cylindrical billet.
(Invention 7)
    The method according to Invention 6, wherein the forging comprises:
    carrying out first forging in a range of from 500° C. to 850° C., and
    carrying out second forging in a range of from 250° C. to 600° C.

Advantageous Effects of Invention

In one aspect, the sputtering targets according to the present disclosure have a crystal grain size of 50 μm or less. This can allow generation of particles during sputtering to be suppressed.

DETAILED DESCRIPTION OF THE INVENTION

Figure 1:
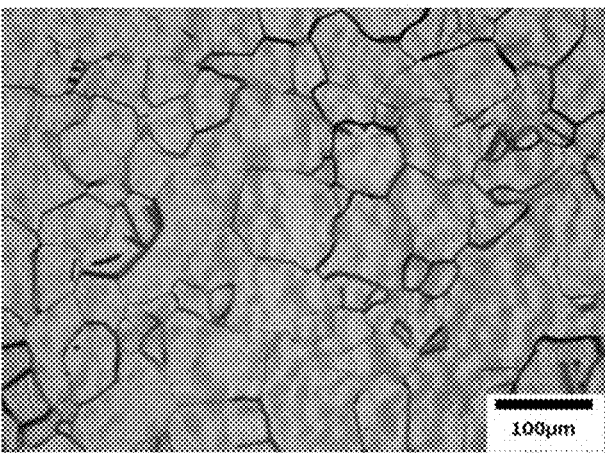
FIG. 1 shows a photograph of a structure of a cylindrical sputtering target in one embodiment.

Hereinafter, specific embodiments for carrying out the invention of the present disclosure will be described. The following descriptions are for facilitating the understanding of the invention according to the present disclosure. That is, they are not intended to limit the scope of the present invention.

1. Sputtering Target

1-1. Structure

In an embodiment, the invention according to the present disclosure relates to a sputtering target. The sputtering target includes at least a target material, and the target material is a portion to be directly sputtered. Further, the sputtering target may further include a substrate (backing tube). If necessary, a bonding layer may be further provided between the substrate and the target material. Known materials can be used for the substrate and the bonding layer.

In an embodiment, a shape of the sputtering target (and target material) is cylindrical. The size is not particularly limited.

1-2. Constituent Elements of Target Material

In an embodiment, the target material is composed of one or more metal elements. Examples of metal elements include, but not limited to, Ti, Nb, Ta, Cu, Co, Mo, W and the like. Further, in addition to one metal element, the target material may be composed of an alloy of a plurality of metal elements. Examples of the alloy include, but not limited to, Ti alloys, Nb alloys, Ta alloys, Cu alloys, Co alloys, Mo alloys, W alloys and the like. Examples of the Ti alloys include, but not limited to, TiAl alloys and TiNb alloys.

When the target material is composed of one metal element (for example, Ti), the purity is 3N (99.9% by mass) or more, and preferably 4N (99.99% by mass) or more, and more preferably 4N5 (99.995% by mass) or more, and even more preferably 5N (99.999% by mass) or more, and most preferably 5N5 (99.9995% by mass) or more. The upper limit may be 8N or less, although not particularly limited thereto. The above purity means a numerical value obtained by composition analysis with glow discharge mass spectrometry (GDMS). For example, in the case of 4N or more, the total amount of elements other than titanium (for example, Na, Al, Si, K, Cr, Mn, Fe, Co, Ni, Cu, Zn, Zr, etc.) is less than 0.01% by mass (100 ppm by mass).

The target material may contain inevitable impurities. Examples of inevitable impurities include O, C and the like. The contents of the impurities is not particularly limited. For example, the content of O may be 1000 ppm by mass or less, and preferably 250 ppm by mass or less, and most preferably 100 ppm by mass or less. For example, the content of C may be 20 ppm by mass or less.

In the target material according to the present disclosure, the reason why the impurity concentration as described above can be achieved is that the target material is not produced by powder sintering (raw material powder is placed in a mold, pressed, and sintered), but instead, the target material is produced using a billet obtained by a melting method. The oxygen concentration in the raw material powder is higher and often exceeds 1000 ppm by mass, although it depends on the types of metals. Accordingly, the target material formed by powder sintering has a higher oxygen concentration. Further, even if the oxygen concentration in the raw material powder is lower, it is highly probable that the oxygen concentration will be increased due to a step such as pulverization, and it will exceed 1000 ppm by mass. However, the target material according to the present disclosure can avoid an increase in the oxygen concentration, because it employs a method of processing a circular pillar shaped billet into a cylindrical billet and then subjecting it to plastic processing such as forging, in place of the method of powder sintering.

1-3. Crystal Grain Size of Target Material

In an embodiment, the metal forming the target material has a specific crystal grain size. More particularly, the crystal grain size is 50 μm or less. Preferably, the crystal grain size is 40 μm or less, and more preferably 30 μm or less. The lower limit of the crystal grain size may be more than 10 μm or more, although not particularly limited thereto. The crystal grain size of 50 μm or less, i.e., a finer crystal grain size, can allow generation of particles to be suppressed.

The crystal grain size described herein can be obtained by measurement in the following procedure. The crystal grain size is determined from an average line segment length per a crystal grain of a test line that intersects the interior of the crystal grains on a surface (sputtering surface) of the sputtering target in accordance with the intercept method of JIS G 0551: 2013. An optical microscope (region: 500 μm×500 μm) or the like can be used for observing the crystal grains in this method.

In the target material according to the present disclosure, the reason why the crystal grain size as described above can be achieved is that the target material is not produced by powder sintering, but instead, the target material is produced using the billet obtained by the melting method. When the powder sintering is carried out, the crystal grain size equivalent to that of the raw material powder grows to a larger crystal grain size by the heat treatment. However, the target material according to the present disclosure can avoid an increase in the crystal grain size, because it employs the method of processing the circular pillar shaped billet into the cylindrical billet and then subjecting it to plastic processing such as forging, in place of the method of the powder sintering.

Further, in the target material according to the present disclosure, another reason why the crystal grain size as described above can be achieved is that the metal material is not molded by an extrusion method, but instead, the target material is produced by using the billet obtained by the melting method. For the extrusion method, the material is heated for the reasons that the metal material must be melted, and the like. This leads to coarse crystal grains in the material (for example, when the material is Ti, a temperature of the extrusion will be about 1000° C., leading to crystal grains having several hundred μm). However, the heat treatment is unavoidable for the molding by the extrusion method. The target material according to the present disclosure can avoid an increase in the crystal grain size, because it employs the method of processing the circular pillar shaped billet into the cylindrical billet and then subjecting it to plastic processing such as forging, in place of the extrusion method.

1-4. Seamless of Target Material

In an embodiment, the target material is seamless. As used herein, the "seamless" refers to the absence of a trace portion in which a plurality of target materials are joined to each other. More particularly, the seamless means that when the structure is observed after etching, any portion having a particular feature is not observed. As used herein, the "portion having a particular feature" means a portion where the crystal grains are coarsened such as by welding to increase the crystal grain size by 20% or more of that of the entire material. Here, a method for measuring the grain size is the same as the method for measuring the crystal grain size of the entire material. Further, when determining whether or not it is seamless, the structure is preferably observed inside the structure (for example, at a position deeper than 2 mm), rather than the surface of the target material. This is because the joined trace portion observed on the surface of the target material can be eliminated by processing the surface of the target material (for example, by grinding). In this regard, the joined trace portion inside the target material is not eliminated by the surface processing, so that an accurate determination can be made.

2. Production Method

In an embodiment, the invention according to the present disclosure relates to a method for producing the sputtering target. The method includes at least the following steps:

a step of processing a circular pillar shaped billet comprising one or more metal elements into a cylindrical billet; and a step of subjecting the cylindrical billet to plastic processing.

Further, the above method may further include a step of annealing and/or a step of machining, as needed. The details will be described below.

2-1. Step of Processing into Cylindrical Billet

Hereinafter, descriptions are made with reference to titanium as an example. First, a titanium circular pillar shaped billet is prepared. A titanium ingot has a purity of 3N (99.9% by mass) or more, and preferably 4N (99.99% by mass) or more, and more preferably 4N5 (99.995% by mass) or more, and further preferably 5N (99.999% by mass) or more, and most preferably 5N5 (99.9995% by mass) or more.

The circular pillar shaped billet is then subjected to drilling to form a cylindrical billet that will be a material of the cylindrical target material. Examples of the drilling process include, but not particularly limited to, gun drilling, lathe processing, and BTA type deep hole drilling.

2-2. Step of Plastic Processing

The cylindrical billet obtained in the above step is subjected to plastic processing. Thus, fine crystal grains can be finally achieved.

A specific method of plastic processing is not particularly limited as long as it can introduce strain into the cylindrical billet, and examples of the plastic processing include forging and rolling. Here, the forging will be specifically described below as an example.

2-2-1. Forging

When forging the cylindrical billet, it is carried out while inserting a core rod into the inner side. Preferably, the forging is carried out in two stages (which are, as used herein, referred to as first forging and second forging, respectively). After the forging, a cylindrical target material is obtained.

Here, a method of forging the circular pillar shaped billet before drilling is also considered. However, this method requires pressing on a thicker material, so that a force is required for a processing machine (especially in the case of Ti, it is hard and a larger force is required). On the other hand, when forging is carried out by making a hole through which a core rod passes, the forging will be performed on a thinner material, so that the force required for the processing machine can be decreased. For this reason, among the first forging and the second forging described later, at least the second forging is preferably carried out on the cylindrical billet after the drilling. The first forging may be carried out on the circular pillar shaped billet before the drilling, but an embodiment as discussed below describes a case where both the first forging and the second forging are carried out on the cylindrical billet after the drilling.

2-2-1-1. First Forging

First, the cylindrical billet obtained in the above step can be subjected to first forging. The purpose of the first forging is to uniform the structure in the cylindrical billet and to stretch-forge it. It can be carried out under a temperature condition of 500° C. to 850° C. If the temperature is lower than 500° C., the cylindrical billet is harder and may crack during forging, so that there is a risk of being deformed into a shape away from a near net shape, resulting in poor stretch. On the other hand, if the temperature is more than 850° C., coarseness of the crystal grains progresses, which is not preferable. Further, for titanium, if the temperature is more than 850° C., transformation of an α phase to a β phase occurs, so that a good metal structure cannot be obtained thereafter. The lower limit of the temperature may preferably be 550° C. or more. The upper limit of the temperature may preferably be less than 700° C.

Figure 2:
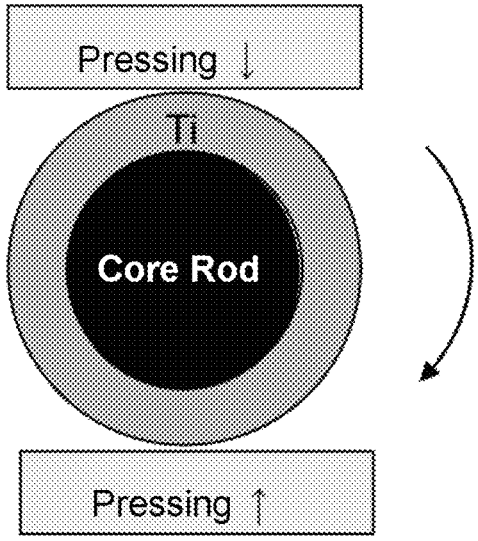
FIG. 2 shows a part of production steps of a cylindrical sputtering target in one embodiment.

The first forging is carried out by heating the cylindrical billet in the above temperature range while inserting the core rod into the inner side of the cylindrical billet. The core rod may preferably be made of CrMo steel, although not particularly limited thereto. Further, since the forging press is uniaxial, it is preferable to repeat the forging while rotating the cylindrical billet around the core rod (FIG. 2).

2-2-1-2. Second Forging

After the first forging step, the second forging step can be carried out on the cylindrical billet. The purpose of the second forging step is to add strain to the structure of the cylindrical billet. It is carried out under a temperature condition of 250° C. to 600° C. More preferably, the second forging is carried out under a temperature condition lower than that in the first forging step. If the temperature is lower than 250° C., the cylindrical billet is harder, so that it is difficult to introduce the strain, and irregularities may easily occur in the structure. On the other hand, if the temperature is higher than 600° C., the strain is released by dynamic recrystallization, so that the grain size cannot be decreased. Further, if the temperature is more than 600° C., any good recrystallized structure cannot be obtained in the subsequent heat treatment step. The lower limit of the temperature may preferably be 300° C. or more. The upper limit of the temperature may preferably be 500° C. or less.

The second forging is also carried out while inserting the core rod into the inner side of the cylindrical billet, as with the first forging. Further, as with the first forging, the second forging is preferably carried out by repeating the forging while rotating the cylindrical billet around the core rod. Further, the repeated forging results in increased distortion of a circular shape as viewed in a cross section. Therefore, in the final stage of the second forging, the forging is preferably carried out so as to form a shape close to a perfect circle.

2-3. Annealing (Recrystallization)

After the second forging, the core rod is removed and the cylindrical target material is preferably subjected to annealing. This can facilitate formation of a fine recrystallized structure in the strained structure. The annealing is carried out under a temperature condition of 300° C. to 600° C. If the temperature is lower than 300° C., it leads to formation of an insufficient recrystallized structure. On the other hand, if the temperature is higher than 600° C., it leads to coarse crystal grains, which is not preferable. The lower limit of the temperature may preferably be 420° C. or more. The upper limit of the temperature may preferably be 550° C. or less. Further, a time of the annealing may be optionally adjusted depending on the size of the cylindrical target material, and it may be, for example, from 0.5 h to 2 h.

2-4. Machining

After the annealing, the cylindrical target material can be machined to finish it into a desired shape and size. The machining includes, but not limited to, cutting, grinding, and the like. Further, at this stage, the machining conditions may be adjusted so as to achieve a desired roundness, eccentricity, and the like.

2-5. Substrate and Bonding Layer

The target material as described above may be bonded to a substrate (a backing tube). This can result in a sputtering target including the substrate and the target material. Further, the joining may be carried out using a brazing material or the like to form a bonding layer between the substrate and the target material.

3. Use of Sputtering Target

The sputtering target as described above can be used for thin film formation. Sputtering is used as a means for forming the thin film, but sputtering conditions are not particularly limited, and sputtering can be carried out under conditions set in the art.

EXAMPLES

Example 1

A billet made of titanium having a purity of 4N5 or more was prepared (φ 200×500 L). A hole of φ 110 was made in the billet by BTA. Thus, a cylindrical billet was formed. The cylindrical billet was heated at 550° C. and a core rod made of CrMo steel was passed through the billet. At the above temperature, the first forging was repeated while rotating the cylindrical billet around the core rod.

The temperature was then decreased to 350° C., and the second forging was repeated while rotating the cylindrical billet around the core rod. Thus, a cylindrical target material was obtained.

Annealing was then carried out at a temperature of 600° C. for 1 hour to promote recrystallization of a crystal structure of the cylindrical target material.

The crystal structure was then observed with an optical microscope. The results are shown in FIG. 1. The crystal grain size was measured by the above method. As a result, the crystal grain size was 40 μm.

Example 2

A cylindrical target material was produced by the same method as that of Example 1, with the exception that the conditions of the forging were appropriately changed.

Figure 3:
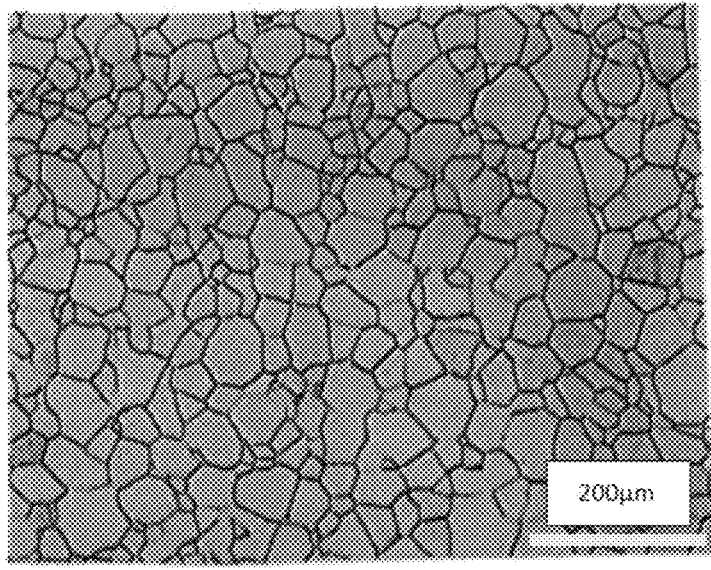
FIG. 3 shows a photograph of a structure of a cylindrical sputtering target in one embodiment.

The crystal structure of the cylindrical target material was observed with an optical microscope. The crystal structure is shown in FIG. 3. The crystal grain size of the cylindrical target material was also measured by the intercept method in observation with an optical microscope (region: 500 μm×500 μm) as described above. As a result, the crystal grain size was 36 μm.

Example 3

A cylindrical target material was produced by the same method as that of Example 1, with the exception that the conditions of the forging were appropriately changed.

Figure 4:
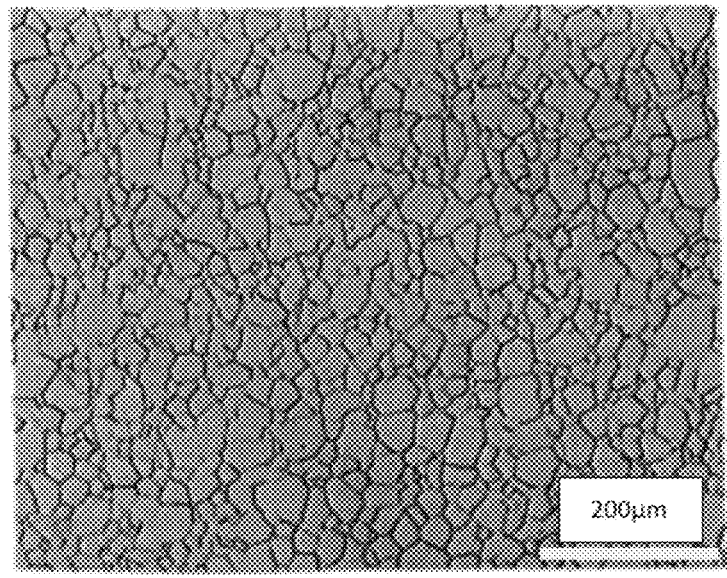
FIG. 4 shows a photograph of a structure of a cylindrical sputtering target in one embodiment.

The crystal structure of the cylindrical target material was observed with an optical microscope. The crystal structure is shown in FIG. 4. The crystal grain size of the cylindrical target material was also measured by the intercept method in observation with an optical microscope (region: 500 μm×500 μm) as described above. As a result, the crystal grain size was 29 μm.

The specific embodiments of the invention according to the present disclosure have been described above. The above embodiments are merely specific examples, and the present invention is not limited to the above embodiments. For example, the technical features disclosed in one of the above embodiments can be applied to other embodiments. Further, unless otherwise specified, it is possible for a specific method to replace some steps with the order of other steps, and an additional step may be added between the two specific steps. The scope of the present invention is defined by the claims.

The invention claimed is:

1. A cylindrical sputtering target, wherein:
the sputtering target comprises at least a target material;
the target material is formed of one or more metal elements or alloys selected from the group consisting of Ti, Nb, Ta, Co, Ti alloys, Nb alloys, Ta alloys, and Co alloys;
the target material has a crystal grain size of 50 μm or less;
the target material has an oxygen concentration of 1000 ppm by mass or less;
an amount of Cu in the target material is less than 0.01% by mass; and,
the sputtering target comprises no substrate.

2. The sputtering target according to claim 1, wherein the crystal grain size is more than 10 μm.

3. The sputtering target according to claim 1, wherein the target material is seamless.

4. A method for producing the sputtering target according to claim 1, comprising the steps of:
processing a circular pillar shaped billet comprising one or more metal elements into a cylindrical billet; and
subjecting the cylindrical billet to plastic processing.

5. The method according to claim 4, wherein the plastic processing comprises forging the cylindrical billet while passing a core rod through the cylindrical billet.

6. The method according to claim 5, wherein the forging comprises:
carrying out first forging in a range of from 500° C. to 850° C., and
carrying out second forging in a range of from 250° C. to 600° C.

7. The sputtering target accordingly to claim 1, wherein a purity of the target material metal element or alloy is at least 3N (99.9% by mass).

8. The sputtering target according to claim 7, wherein a purity of the target material metal element or alloy is 4N (99.99% by mass) or more.

9. The sputtering target according to claim 7, wherein a purity of the target material metal element or alloy is 4N5 (99.995% by mass) or more.

10. The sputtering target according to claim 7, wherein a purity of the target material metal element or alloy is 5N (99.999% by mass) or more.

11. The sputtering target according to claim 7, wherein a purity of the target material metal element or alloy is 5N5 (99.9995% by mass) or more.

12. A cylindrical sputtering target, wherein:
the sputtering target comprises at least a target material;
the target material is composed of an ingot formed of one or more metal elements or alloys selected from the group consisting of Ti, Nb, Ta, Co, Ti alloys, Nb alloys, Ta alloys, and Co alloys;
the target material has a crystal grain size of 50 μm or less;
the target material has an oxygen concentration of 1000 ppm by mass or less; and,
an amount of Cu in the target material is less than 0.01% by mass.

13. The sputtering target according to claim 1, wherein the target material is TiAl or TiNb.

14. The sputtering target according to claim 12, wherein the target material is TiAl or TiNb.

\* \* \* \* \*